(12) United States Patent
Matayabas, Jr. et al.

(10) Patent No.: US 7,999,042 B2
(45) Date of Patent: Aug. 16, 2011

(54) LOW COEFFICIENT OF THERMAL EXPANSION (CTE) THERMOSETTING RESINS FOR INTEGRATED CIRCUIT APPLICATIONS

(75) Inventors: James C. Matayabas, Jr., Chandler, AZ (US); Tian-An Chen, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 1720 days.

(21) Appl. No.: 10/876,444

(22) Filed: Jun. 25, 2004

(65) Prior Publication Data

US 2005/0288454 A1    Dec. 29, 2005

(51) Int. Cl.
*C08L 63/00*    (2006.01)
(52) U.S. Cl. ........................................ 525/523; 525/533
(58) Field of Classification Search .......................... None
See application file for complete search history.

(56) References Cited

U.S. PATENT DOCUMENTS

| | | | | |
|---|---|---|---|---|
| 5,218,062 A | * | 6/1993 | Earls et al. | 525/526 |
| 5,264,502 A | * | 11/1993 | Hefner et al. | 525/529 |
| 5,412,057 A | * | 5/1995 | Hefner et al. | 528/96 |
| 5,567,749 A | * | 10/1996 | Sawamura et al. | 523/443 |

FOREIGN PATENT DOCUMENTS

| | | | | |
|---|---|---|---|---|
| JP | 2-117913 A | * | 5/1990 | |
| JP | 6-179736 A | * | 6/1994 | |

OTHER PUBLICATIONS

Mihara et al., "Synthesis and Thermal Properties of Combined Liquid Crystalline Epoxy Resins," Journal of Applied Polymer Science, 1998, vol. 68, pp. 1979-1990.*
CAPLUS accession No. 2004:207556 for Ichikawa et al., "Electronic structure and molecular orientation of epoxy resin network chains and its application for molding compound for IC packages," Nippon Setchaku Gakkaishi, 2004, two pages.*

* cited by examiner

*Primary Examiner* — Robert Sellers
(74) *Attorney, Agent, or Firm* — Blakely, Sokoloff, Taylor & Zafman LLP

(57) ABSTRACT

An embodiment of the present invention is a technique to form a resin. A mixture is formed by a curing agent dissolved in the epoxy resin. The epoxy resin contains a first rigid rod mesogen. The curing agent contains a second rigid rod mesogen and one of a hydroxyl, amine, and anhydride.

8 Claims, 4 Drawing Sheets

LOW COEFFICIENT OF THERMAL EXPANSION (CTE) THERMOSETTING RESINS FOR INTEGRATED CIRCUIT APPLICATIONS

BACKGROUND

1. Field of the Invention

Embodiments of the invention relate to the field of semiconductor, and more specifically, to semiconductor materials.

2. Description of Related Art

The next generation die interlayer dielectric (ILD) materials are porous and poor mechanical strength. Low CTE materials may be used to reduce the stresses on the ILD due to coefficient of thermal expansion (CTE) mismatches between materials in the package. In addition, since materials flow over greater distances through narrower gaps, the concentration of the filler, which is typically used to reduce the CTE, may be eliminated, reduced, or minimized.

Existing techniques to reduce the CTE and at the same time reduce or eliminate the concentration of the filler has a number of disadvantages. One technique uses an epoxy resin filled with 40-80 weight percent of silica filler. This technique may reduce the CTE but also gives high modulus and high viscosity.

BRIEF DESCRIPTION OF THE DRAWINGS

The invention may best be understood by referring to the following description and accompanying drawings that are used to illustrate embodiments of the invention. In the drawings.

DESCRIPTION

An embodiment of the present invention is a technique to form a resin. A mixture is formed by a curing agent dissolved in the epoxy resin. The epoxy resin contains a first rigid rod mesogen. The curing agent contains a second rigid rod mesogen and one of a hydroxyl, amine, and anhydride.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, a method of manufacturing or fabrication, etc.

One embodiment of the invention is to provide a thermosetting resin including in the polymer backbone greater than 50 weight percentage of a rigid rod mesogen and having, after cure, an isotropic CTE less than 40 ppm/° C. The resin may be processable at temperatures below 150° C. and curable at temperatures below 200° C. The resulting resin is useful for integrated circuit (IC) applications including being used as underfill, mold compound, die attach, substrate dielectric, and similar elements. These applications may also be used in IC packaging.

Figure 1:
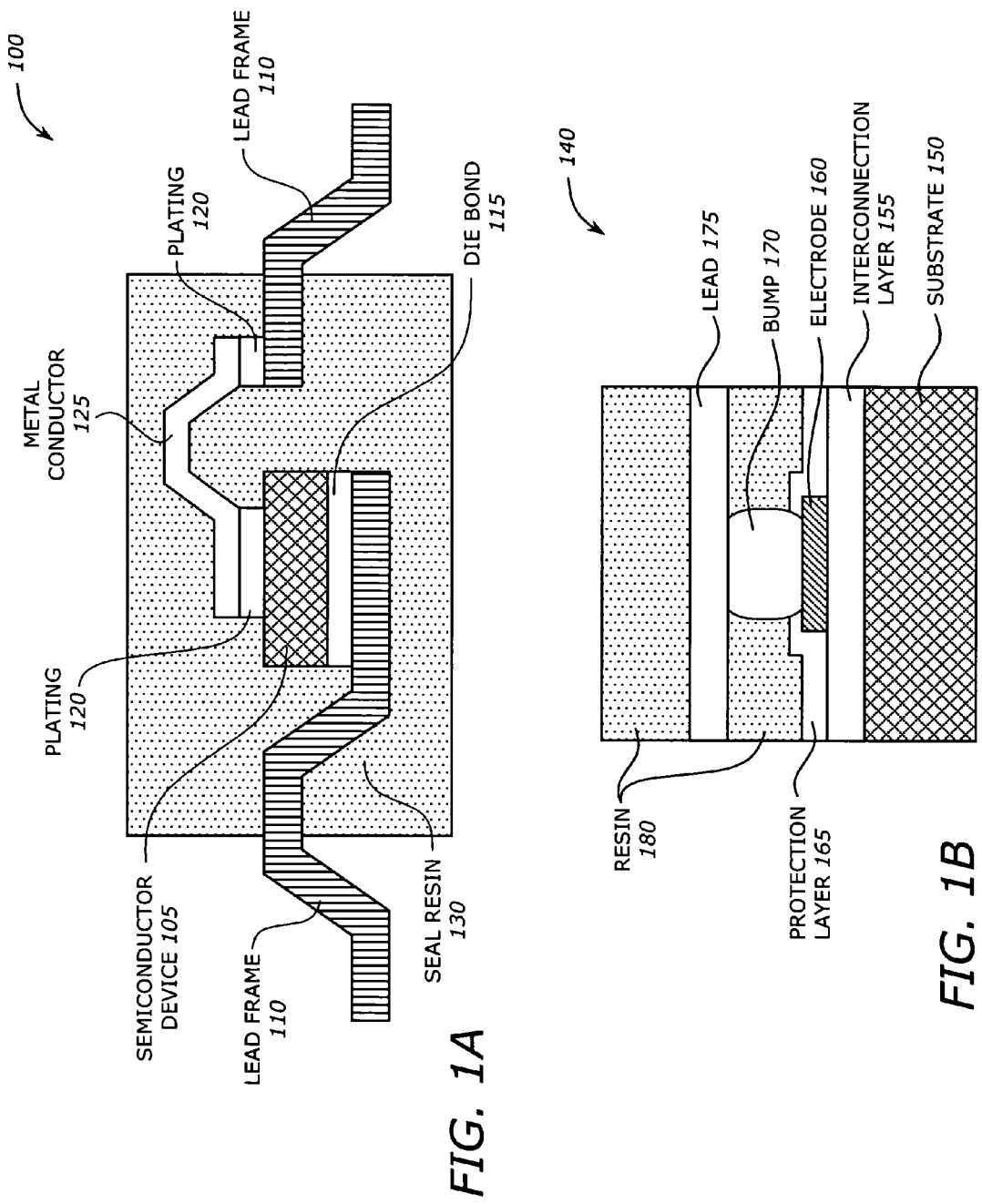
FIG. 1A is a diagram illustrating a semiconductor package in which one embodiment of the invention can be practiced.
FIG. 1B is a diagram illustrating a semiconductor device in which one embodiment of the invention can be practiced.

FIG. 1A is a diagram illustrating a package 100 in which one embodiment of the invention can be practiced. The package 100 includes a semiconductor device 105, lead frames 110, die bond 115, platings 120, metal conductor 125, and a resin 130.

The semiconductor device 105 is any integrated circuit (IC) device. It may be fabricated by any Metal Oxide Semiconductor (MOS) technology. It may be a memory chip, a processor, a chipset, a logic device, a micro-controller, a microprocessor, etc. The lead frames 110 provide interconnections to other devices or elements. They may be made of copper or copper alloy or any other suitable conducting material. The die bond 115 provides electrical connections between the semiconductor device 105 and the lead frame 110.

The plating 120 provides contact interface between the semiconductor device 105 and the metal conductor 125. It may be made of silver to prevent oxidation and maintain conductivity of the metal conductor 125. The metal conductor 125 provides electrical connection between the semiconductor device 105 and the lead frame 110. It may be made of copper or copper alloy. The resin 130 provides sealing to the entire assembly. The resin 130 has a low CTE and is made by one embodiment of the invention.

FIG. 1B is a diagram illustrating a semiconductor device 140 in which one embodiment of the invention can be practiced. The semiconductor 140 includes a substrate 150, an interconnection layer 155, an electrode 160, a protection layer 165, a bump 170, a lead 175, and a resin 180.

The substrate 150 is any substrate layer in a typical semiconductor device. It may be a silicon layer. The interconnection layer 155 provides a number of layers of insulators and conductors for the integrated circuit. The electrode 160 is typically formed at the periphery of the device. The protection layer 165 provides protection for the interconnection layer 155 and an interface to the resin 180. It is typically made of resin of the polyimide group. The bump 170 provides electrical and mechanical interface between the electrode 160 and the lead 175. The bump 170 may be made by gold and bonded to the electrode 160. The lead 175 provides interconnection between the device 140 and other devices.

The resin 180 is deposited or coated on the protection layer 165. It is typically cured in a heat treatment process. The resin 180 has low CTE and is made by one embodiment of the invention.

Figure 2:
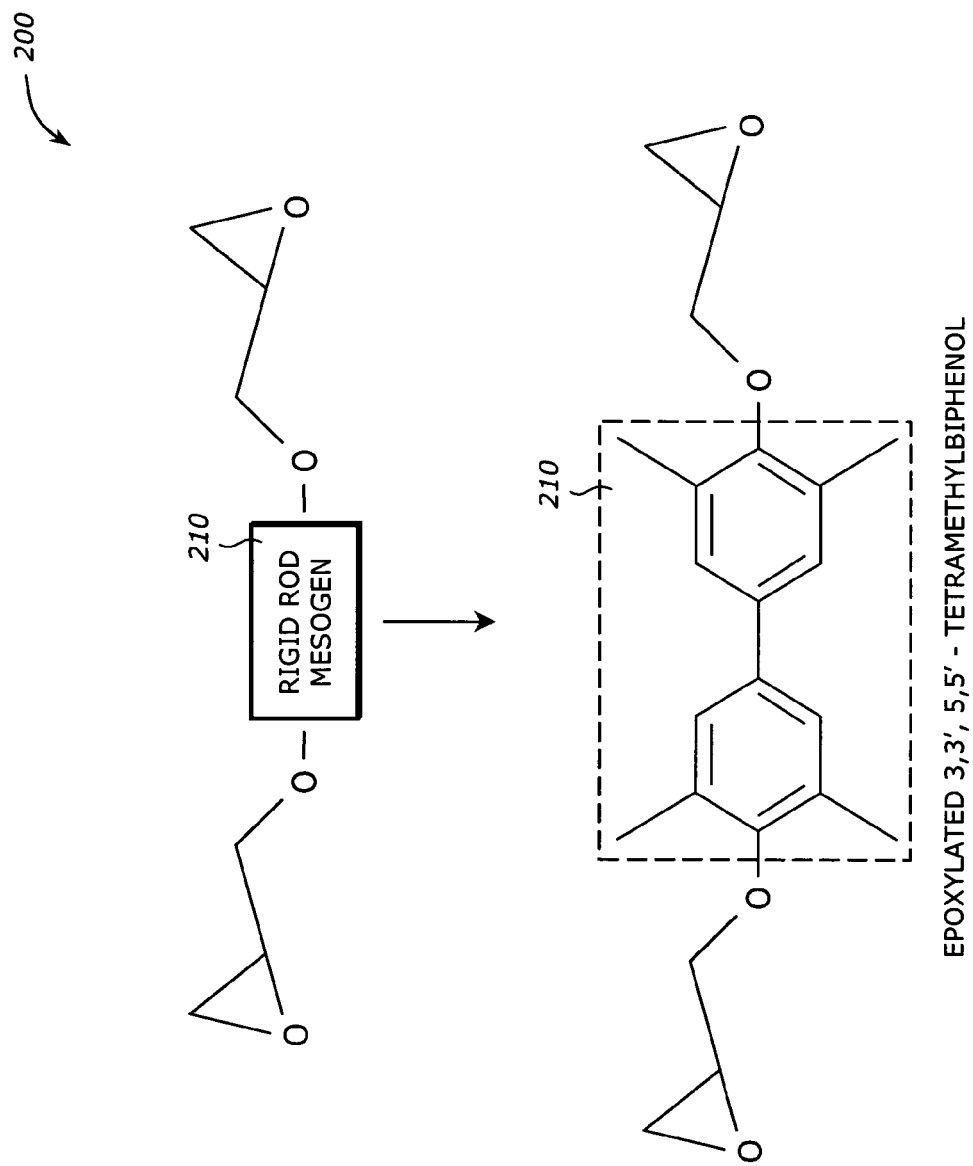
FIG. 2 is a diagram illustrating a structure of an epoxy resin according to one embodiment of the invention.

FIG. 2 is a diagram illustrating a structure of an epoxy resin 200 according to one embodiment of the invention.

The epoxy resin 200 contains a rigid rod mesogen 210. The rigid rod like mesogen 210 contains molecules which are components of liquid crystalline materials. Studies indicate that the CTE of an unfilled, unoriented epoxy resin comprising a rigid rod mesogen which induces liquid crystallinity decreases to 45 ppm/° C. with increasing mesogen concentration. It is expected by increasing greater than 50% weight percentage of a rigid rod mesogen, the CTE is decreased further to below 40 ppm/° C. In one embodiment, the epoxy resin is epoxylated 3,3',5,5'-tetra-methylbiphenol.

Figure 3:
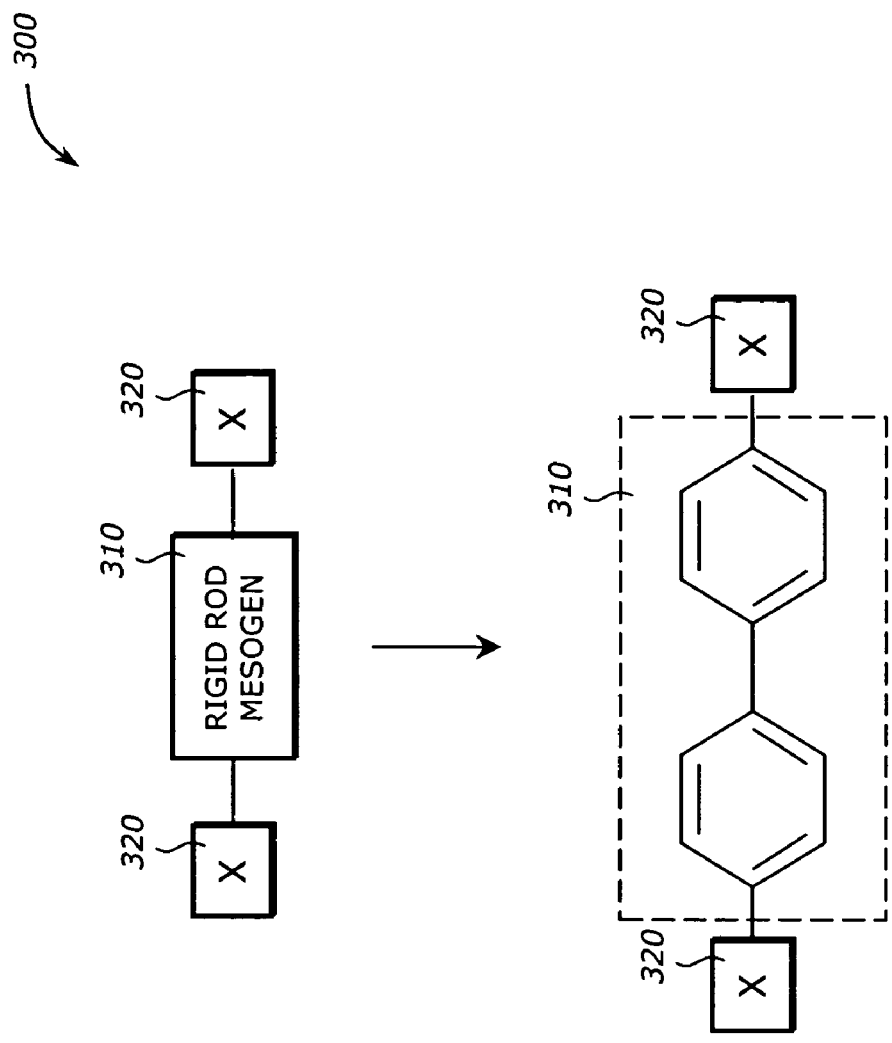
FIG. 3 is a diagram illustrating a structure of a curing agent according to one embodiment of the invention.

FIG. 3 is a diagram illustrating a structure of a curing agent 300 according to one embodiment of the invention.

The curing agent 300, or the crosslinker, is formed by a rigid rod mesogen 310 and element X 320. The element X 320 is selected from a group consisting of hydroxyl (—OH), amine (—NH$_2$), and anhydride (—COOOC—).

In one embodiment, the curing agent 300 is 4,4'-diphenol where X=OH. Because of the high melting point of the 4,4'-diphenol (about 180° C.), the epoxy resin 200 and the curing agent 300 are pre-mixed in a stoichometric ration of one mole of epoxy to one mole of phenol at approximately 150° C., in order to dissolve the curing agent 200 in the epoxy resin 300. This mixture, which has a melting point below 150° C., is then used to prepare for the final formulation. A variety of additives may be added to the mixture. These additives include catalyst, adhesive, flow aids, mold release agents, colorants, and other additives. Optionally, a filler may be added to the mixture to further reduce the CTE of the resulting material.

In another embodiment, the curing agent 300 is 4,4'-dianiline (X=NH$_2$). Due to the relatively low melting point of the 4,4'-dianiline (about 128° C.), the material may be used directly to prepare the final formulation or may be pre-mixed.

By using the epoxy resin and the curing agent both containing a rigid rod mesogen, the weight percentage of the mesogen is essentially doubled, allowing achievement of approximately 70-80 weight percent mesogen, or a percentage that is higher than 50%. This weight percentage of mesogen gives a CTE below 40 ppm/° C.

Figure 4:
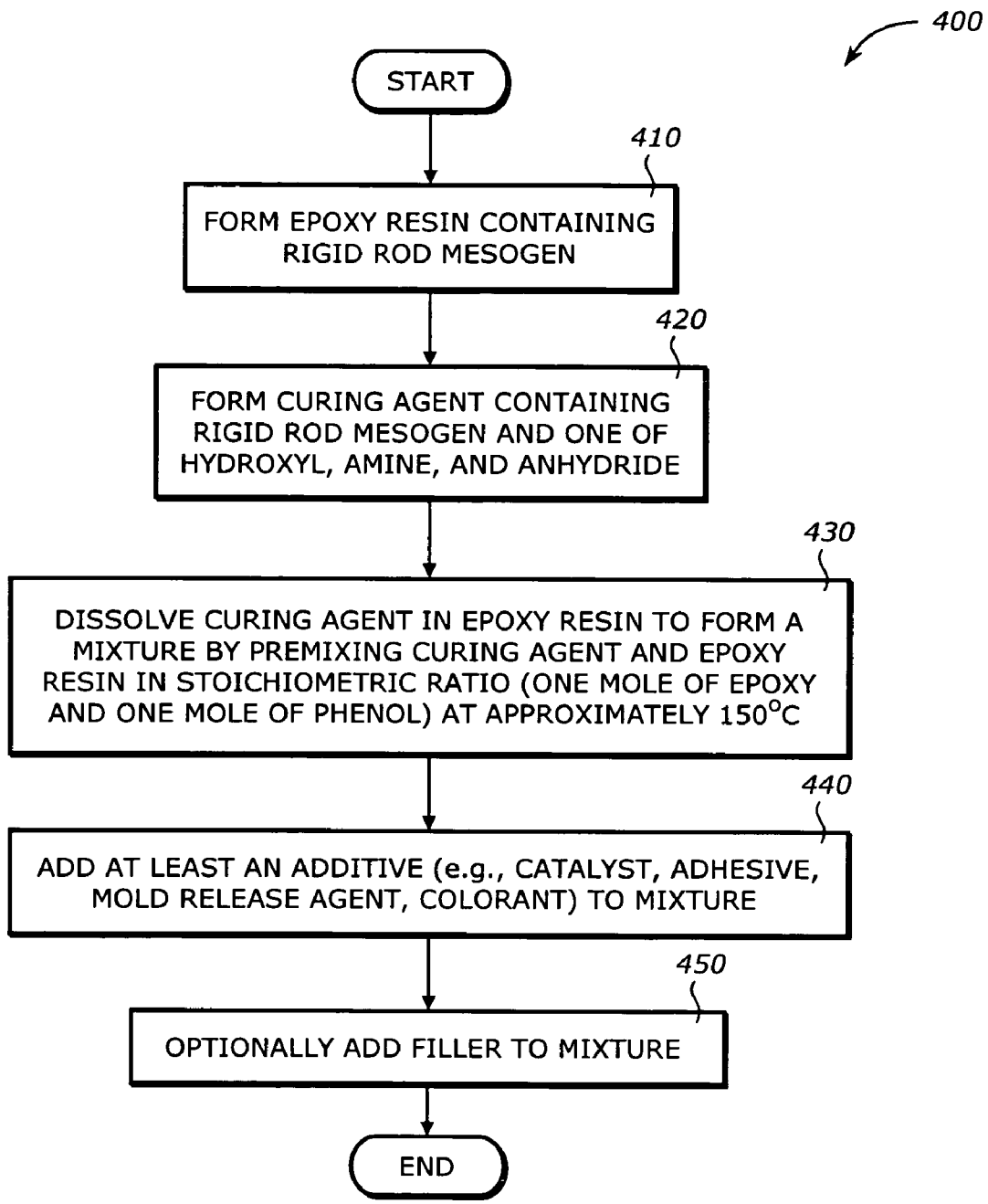
FIG. 4 is a diagram illustrating a process to form the resin according to one embodiment of the invention.

FIG. 4 is a diagram illustrating a process 400 to form the resin according to one embodiment of the invention.

Upon START, the process 400 forms an epoxy resin containing a first rigid rod mesogen (Block 410). In one embodiment, the epoxy resin is epoxylated 3,3',5,5'-tetra-methylbiphenol. Next, the process 400 forms a curing agent containing a second rigid rod mesogen and one of a hydroxyl, amine, and anhydride (Block 420). In one embodiment, the curing agent is one of 4,4'-diphenol and 4,4'-dianiline. Then, the process 400 dissolves the curing agent in the epoxy resin to form a mixture (Block 430). This can be performed by pre-mixing the epoxy resin and the curing agent in a stoichiometric ratio of one mole of epoxy to one mole of phenol at approximately 150° C.

Next, the process 400 adds at least an additive to the mixture (Block 440). The additive may be any one of a catalyst, an adhesive, a mold release agent, and a colorant, or any other additives. Then, the process 400 adds a filler to the mixture (Block 450) and is then terminated. Blocks 440 and 450 may be performed alternatively, separately, sequentially or in parallel.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   forming an epoxy resin containing a first rigid rod mesogen;
   forming a curing agent containing a second rigid rod mesogen a hydroxyl; and
   dissolving the curing agent in the epoxy resin to form a mixture such that the mixture has a weight percentage of mesogen higher than 50%;
   wherein the dissolving comprises pre-mixing the epoxy resin and the curing agent in a stoichiometric ratio of one mole of epoxy to one mole of phenol at a first temperature.

2. The method of claim 1 further comprising:
   adding to the mixture at least an additive.

3. The method of claim 2 wherein adding comprises:
   adding to the mixture at least the additive being one of a catalyst, an adhesive, a mold release agent, and a colorant.

4. The method of claim 2 wherein adding further comprises:
   adding a filler.

5. The method of claim 1 wherein forming the epoxy resin comprises:
   forming the epoxy resin being epoxylated 3, 3', 5, 5'-tetra-methylbiphenol.

6. The method of claim 1 wherein forming the curing agent comprises:
   forming the curing agent being 4, 4'-diphenol.

7. The method of claim 1 wherein the first temperature is approximately 150 degrees Celsius.

8. The method of claim 1 wherein the mixture has a coefficient of thermal expansion (CTE) less than 40 ppm/° C.

* * * * *